US007808291B2

(12) United States Patent
Nakamura et al.

(10) Patent No.: US 7,808,291 B2
(45) Date of Patent: Oct. 5, 2010

(54) JITTER GENERATING CIRCUIT

(75) Inventors: Takayuki Nakamura, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 546 days.

(21) Appl. No.: 11/916,247

(22) PCT Filed: Jun. 18, 2006

(86) PCT No.: PCT/JP2006/309923

§ 371 (c)(1), (2), (4) Date: Nov. 30, 2007

(87) PCT Pub. No.: WO2006/129491

PCT Pub. Date: Dec. 7, 2006

(65) Prior Publication Data

US 2010/0201421 A1     Aug. 12, 2010

(30) Foreign Application Priority Data

Jun. 1, 2006   (JP)   ............................. 2005-160832

(51) Int. Cl.
 *H03H 11/16*   (2006.01)
(52) U.S. Cl. .......................... 327/246; 702/66; 375/248
(58) Field of Classification Search ................. 327/237, 327/246, 248; 375/224, 226; 702/66, 69
See application file for complete search history.

(56) References Cited

U.S. PATENT DOCUMENTS

| 6,798,831 | B1 * | 9/2004 | Hatta ........................ 375/224 |
| 7,557,561 | B2 * | 7/2009 | Awaji et al. ............. 324/76.77 |
| 2004/0143406 | A1 | 7/2004 | Nishikobara et al. |
| 2005/0097420 | A1 | 5/2005 | Frisch et al. |

FOREIGN PATENT DOCUMENTS

| JP | 2001-244797   | 9/2001 |
| JP | 2002-108967   | 4/2002 |
| JP | 2004-242304 A | 8/2004 |
| JP | 2004-310294 A | 11/2004 |

* cited by examiner

*Primary Examiner*—An T Luu
(74) *Attorney, Agent, or Firm*—patenttm.us

(57) ABSTRACT

A jitter generating circuit wherein a simple structure can be used to generate a pattern effect jitter. A jitter generating circuit 1 comprises a driver input circuit 20 that serves as a signal analyzing unit for analyzing the contents of the signal pattern of an input signal; a plurality of gain adjusting circuits 30; a plurality of lowpass filters 40; a plurality of adders 50; an adder 52; and a driver output circuit 60 that outputs a signal obtained by adjusting, in accordance with a signal analysis result, the phase of the input signal in such a direction in which the change timing deviates when the input signal is transmitted to the transmission line. Thus, the phase of an input signal is adjusted, thereby adding the jitter to the input signal.

14 Claims, 4 Drawing Sheets (A)

t10 t11

(B)

t20   t21

(C)

t30 t31

(A)

(B)

JITTER GENERATING CIRCUIT

TECHNICAL FIELD

The present invention relates to a jitter generating circuit for providing fluctuations at the rising edge and the falling edge of a signal.

BACKGROUND ART

When jitter resistance of devices under test (hereinafter, will be referred to as "DUTs") is tested in semiconductor testers, it is necessary to add jitter to test patterns applied to the DUTs. Jitter generating circuits are used for this purpose (e.g., see patent document 1). In such a jitter generating circuit, by comparing the offset voltage of a sinusoidal wave and the output voltage of a ramp generator, sinusoidal fluctuations are provided at a time when a clock signal changes.

[Patent document 1] Japanese Patent Laid-Open No. 6-104708 (pp. 3 to 4, FIGS. 1 to 3)

DISCLOSURE OF THE INVENTION

Jitter added to signals actually inputted to a DUT includes pattern effect jitter that depends upon an input signal pattern, in addition to jitter that does not depend upon an input signal pattern and is added using the jitter generating circuit and the like of patent document 1. For example, when a signal outputted from a driver is transmitted to a DUT through a transmission line having a loss, the timing of the rising edge of the signal is delayed by the loss of the transmission line. Further, in this case, if sometimes a transition is not completely made from a high level to a low level or vice versa according to a pattern, jitter changing with the pattern is added. The magnitude of the jitter is determined by a combination of the magnitude of the loss of the transmission line and the input signal pattern. Thus the pattern effect jitter can be added to the signal by reproducing, each time the jitter is added, the transmission line used for an apparatus actually including the DUT. However, it is substantially impossible to reproduce an actual transmission line for a DUT having multiple pins, and simple configurations capable of generating pattern effect jitter have been demanded.

The present invention is designed in consideration of this point. An object of the present invention is to provide a jitter generating circuit capable of generating pattern effect jitter with a simple configuration.

In order to solve the problem, a jitter generating circuit of the present invention includes a signal analyzing unit for analyzing the contents of the signal pattern of an input signal, and a phase adjusting unit for outputting a signal obtained by adjusting the phase of the input signal in a such a direction that the timing of a change is deviated during the passage of the input signal through a transmission line according to an analysis result by the signal analyzing unit, wherein the jitter generating circuit adds jitter by adjusting the phase of the input signal. A loss occurring during actual passage of a signal through the transmission line changes a timing when the signal received through the transmission line exceeds or falls below a predetermined threshold voltage. The timing deviation is closely related to the contents of the signal pattern of the input signal. In the present invention, the phase of the input signal is adjusted according to the contents of the signal pattern of the input signal, so that pattern effect jitter similar to jitter generated on the transmission line can be generated according to the contents of the signal pattern. Further, there is no need for the same wiring and so on as the actual transmission line, thereby generating pattern effect jitter with a simple configuration.

It is desirable that the signal analyzing unit analyze the frequency characteristics of the input signal. It can be considered that pattern effect jitter generated through the transmission line according to the contents of the signal pattern of the input signal mainly depends upon a state of a voltage change of the input signal, that is, a frequency. Therefore, by analyzing the frequency characteristics of the input signal and adding jitter, it is possible to generate pattern effect jitter closer to an actual state.

Further it is desirable that the signal analyzing unit has a filter for passing the low frequency components of the input signal and the phase adjusting unit adjusts the phase according to the output voltage of the filter. Thus the frequency characteristics of the input signal can be easily detected.

Moreover, it is desirable that the signal analyzing unit has a plurality of filters having different cutoff frequencies for passing the low frequency components of the input signal and a combining unit for combining the output voltages of the plurality of filters, and it is desirable that the phase adjusting unit adjusts the phase according to the combined voltage of the combining unit. Thus it is possible to adjust the amount of variable jitter according to the signal pattern of the input signal, thereby generating proper pattern effect jitter according to the signal pattern.

Further, it is desirable that the filter be fed with a signal in opposite phase with the input signal. Alternatively, it is desirable that the phase adjusting unit adjusts the phase according to a voltage obtained by subtracting the output voltage of the filter from a predetermined voltage. Thus it is possible to adjust the phase of the input signal in such a direction that the timing of a change is deviated during the passage of the input signal through the transmission line, thereby reproducing pattern effect jitter generated through the transmission line.

Moreover, it is desirable that the signal analyzing unit has a gain adjusting unit for adjusting the gain of the output voltage of the filter. Particularly, it is desirable that the gain adjusted by the gain adjusting unit be set according to a degree of a signal loss caused by the transmission line. Thus it is possible to adjust the phase of the signal in consideration of the characteristics of the assumed transmission line and generate various kinds of pattern effect jitter for various transmission lines by means of a shared circuit.

Moreover, it is desirable that the phase adjusting unit be a differential amplifier that a reference voltage is changed according to an analysis result of the signal analyzing unit. Alternatively, it is desirable that the phase adjusting unit be a voltage comparator that a reference voltage is changed according to an analysis result of the signal analyzing unit. It is desirable that the phase adjusting unit be a variable delay circuit that a delay amount is changed according to an analysis result of the signal analyzing unit. Thus it is possible to easily change the timing of a change of the signal (the phase of the signal) transmitted to the transmission line with reliability.

Further, it is desirable that the signal analyzing unit and the phase adjusting unit be included in a chip or a module where a circuit for outputting the input signal is formed. Thus it is possible to reduce the size of the overall configuration including the jitter generating circuit and the circuit for outputting the input signal and reduce the cost due to the simplified manufacturing process and a reduction in the number of components.

DESCRIPTION OF SYMBOLS

Figure 1:
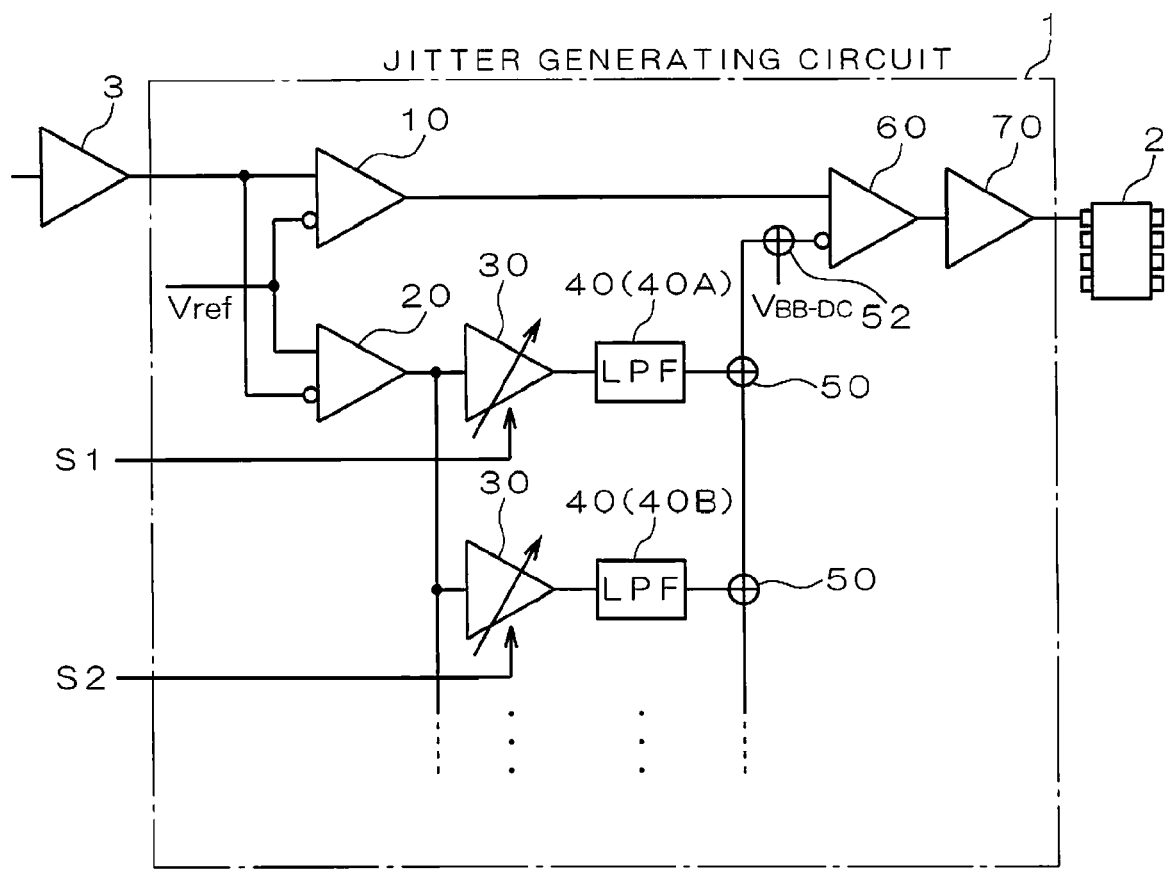
FIG. 1 is a view that illustrates the configuration of the jitter generating circuit according to an embodiment.

1 Jitter generating circuit
2 DUT (Device Under Test)
3 Driver
10, 20 Driver input circuits
30 Gain adjusting circuits
40 Low-pass filters (LPFs)
50, 52 Adders
60 Driver output circuit
70 Waveform shaping circuit
100 First circuit
102, 104, 120, 202, 204, 220 Transistors
106, 206 Variable constant current circuits
110, 112, 210, 212, 302, 310, 312, 314 Resistors
114, 214 capacitors
122, 222, 304 Constant current circuits
200 Second circuit

BEST MODE FOR CARRYING OUT THE INVENTION

A jitter generating circuit according to an embodiment of the present invention will now be specifically described with reference to the accompanying drawings.

FIG. 1 illustrates the configuration of the jitter generating circuit according to an embodiment. As shown in FIG. 1, a jitter generating circuit 1 of the present embodiment includes a driver input circuits 10 and 20, a plurality of gain adjusting circuits 30, a plurality of low-pass filters (LPFs) 40 (40A, 40B, . . . ), a plurality of adders 50, an adder 52, a driver output circuit 60 and a waveform shaping circuit 70. A jitter generating circuit 1 is provided between a DUT 2 and a driver 3 for outputting a signal to the DUT 2. The jitter generating circuit 1 adds pattern periodic jitter to the signal outputted from the driver 3 to the DUT 2. The pattern periodic jitter corresponds to the contents of a signal pattern of the signal.

A driver input circuit 10 is a differential amplifier having one input end fed with a reference signal having a predetermined reference voltage Vref and the other input end fed with the output signal of the driver 3, and the driver input circuit 10 outputs a signal in phase with the signal inputted from the driver 3. The reference voltage Vref is set at the mean voltage (50% voltage) of the low level and the high level of the signal inputted from the driver 3. The signal outputted from the driver input circuit 10 is inputted to a driver output circuit 60 including a differential amplifier. A driver input circuit 20 is a differential amplifier having one input end fed with the output signal of the driver 3 and the other input end fed with the reference signal having the predetermined reference voltage Vref, and the driver input circuit 20 outputs a signal of opposite phase with the signal inputted from the driver 3. The two driver input circuits 10 and 20 are differential amplifiers having the same configuration but the two input signals have opposite relationships. Each of the gain adjusting circuits 30 can set gains in response to control data S1, S2, . . . that are inputted from the outside. The gain adjusting circuits 30 amplify or attenuate, with the set gains, the respective signals outputted from the driver input circuit 20, and then output the signals, respectively. Each of the low-pass filters 40 (40A, 40B, . . . ) pass the low frequency components of the signals having passed through the corresponding gain adjusting circuits 30. In the present embodiment, there are provided a plurality of processing systems, each including the gain adjusting circuit 30 and the low-pass filter 40. Each of the adders 50 add the output voltages of the plurality of low-pass filters 40 included in the plurality of processing systems. The adder 52 adds the added voltage of the plurality of adders 50 to a predetermined voltage $V_{BB-DC}$ to generate a reference voltage $V_{BB}$. The reference voltage $V_{BB}$ is inputted to the driver output circuit 60. The driver output circuit 60 is fed with the signal outputted from the driver input circuit 10 and the reference signal of the reference voltage $V_{BB}$ outputted from the adder 52, and the driver output circuit 60 performs differential amplification using these two signals. A signal outputted from the driver output circuit 60 is subjected to waveform shaping by a waveform shaping circuit 70 and then is outputted from the jitter generating circuit 1. After that, the signal is inputted to the input pin or the input/output pin of the DUT 2.

The plurality of low-pass filters 40 correspond to a signal analyzing unit, an adder 52 and the driver output circuit 60 correspond to a phase adjusting unit, a plurality of adders 50 correspond to a combining unit, and the plurality of gain adjusting circuits 30 correspond to a gain adjusting unit.

The jitter generating circuit 1 of the present embodiment is configured thus. The following is the operations of the jitter generating circuit 1. The plurality of low-pass filters 40A, 40B, . . . have different cutoff frequencies and pass different frequency components. When it is difficult for a single filter to reproduce the jitter generated through an actual transmission line, the outputs of the respective filters may be combine, or alternatively, some of the filters may be switched to operate.

Figure 2:
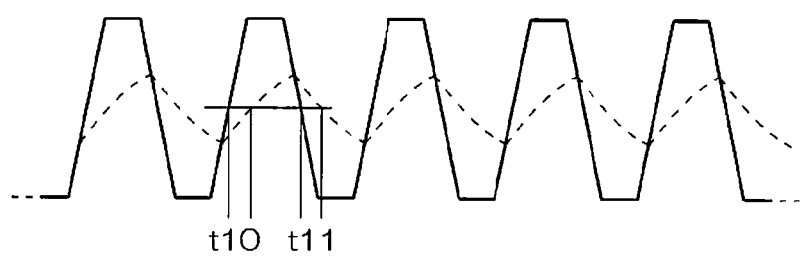
FIG. 2 is an explanatory drawing showing the attenuation of a signal generated by a loss caused by the transmission line.
Figure 2:
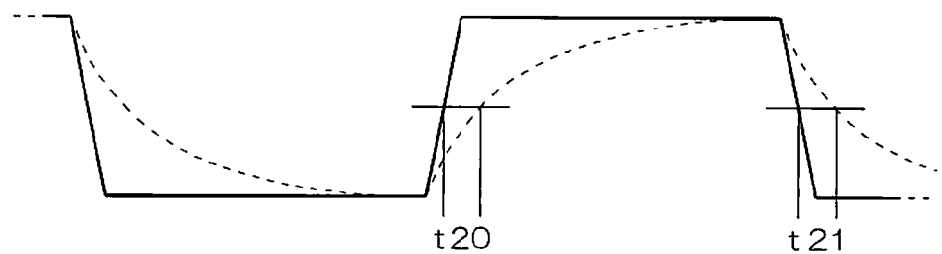
Figure 2:
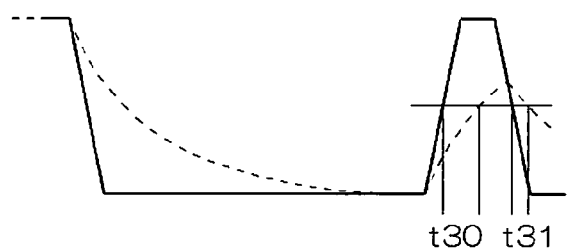

FIG. 2 is an explanatory drawing showing attenuation of a signal generated by the loss caused by the transmission line used in an environment where the DUT 2 is actually mounted. FIG. 2 shows an extremely large loss to explain the attenuation of the signal. In FIG. 2(A), a dotted line indicates a state in which a high frequency signal having a signal pattern A is inputted to the transmission line. When the transmission line connected to the DUT 2 has a large loss, the subsequent change of the state occurs before the voltage of a signal sufficiently changes from a low level to a high level or vice versa. Timing deviations at this point are represented as t10 and t11. In FIG. 2(B), a dotted line indicates a state in which a low frequency signal having a signal pattern C is inputted to the transmission line. When the transmission line has a large loss, it takes a certain time to sufficiently change a signal voltage from a low level to a high level or vice versa. In the signal pattern C, a high-level or low-level period is long, and thus the signal changes up/down to a voltage level close to a high/low level. Timing deviations at this point are represented as t20 (≠t10) and t21 (≠t11). To an actual transmission line, a signal obtained by suitably combining the signal of FIG. 2(A) and the signal of FIG. 2(B) is inputted as shown in FIG. 2(C). In the example of FIG. 2(C), at this point, a timing deviation t30 at the rising edge of the signal is equal to the timing deviation t20 at the rising edge of the signal pattern C shown in FIG. 2(B) but a timing deviation t31 at the falling edge of the signal is not equal to the timing deviation t21 at the falling edge of the signal pattern C shown in FIG. 2(B). In this way, the timing deviation at the rising edge and the timing deviation at the falling edge vary according to the patterns of the signal inputted to the transmission line. In the present embodiment, low frequency components generated by combining signals of various patterns are detected using the plurality of low-pass filters 40A, 40B, . . . .

The gain adjusting circuits 30 respectively provided in the previous stage of the low-pass filters 40 amplify or attenuate signals relative to a voltage outputted from the driver input circuit 20, with gains set according to the control data (S1, S2, . . . ). Characteristics (the amount of loss and the dependence of the loss on a frequency) vary with the length, shape, and so on of the assumed transmission line. Thus even the same input signal has different degrees of attenuation after passing through the transmission line. In order to generate pattern effect jitter corresponding to the assumed transmission line, the contents of the control data S1, S2, . . . are changed and the gains of the gain adjusting circuits 30 are set to be variable. For example, it is preferable that for a plurality of transmission lines having various characteristics, the values of the control data S1, S2, . . . for generating proper pattern effect jitter corresponding to the transmission lines are determined beforehand by experiments, simulations and so on, the characteristics of the actually used transmission line are measured, and the control data S1, S2, . . . corresponding to the measured characteristics are used.

In the plurality of adders 50, the output voltages of the plurality of low-pass filters 40 are added (combined). The adder 52 generates a reference signal having a reference voltage $V_{BB}$ by adding the added voltages by the plurality of adders 50 to a predetermined voltage $V_{BB\text{-}DC}$, and the adder 52 inputs the generated reference signal to the driver output circuit 60. For example, the mean voltage (50% voltage) of the low level and the high level of the input signal is used as the predetermined voltage $V_{BB\text{-}DC}$, and the voltages obtained by superimposing the output voltages of the adders 50 of the final stage obtained by analyzing the frequency components of the input signal by means of the low-pass filters 40 onto the voltage $V_{BB\text{-}DC}$ are inputted to the driver output circuit 60. Therefore, the voltage level of the reference signal inputted to the driver output circuit 60 can be changed in accordance with the frequency of the input signal. It is possible to adjust the timing of the rising edge and the falling edge of the signal obtained as a differential amplification output for the voltage level of the reference signal, according to the contents of the signal pattern of the input signal.

As described above, in the jitter generating circuit 1 of the present embodiment, the phase of the input signal is adjusted according to the contents of the signal pattern of the input signal, so that pattern effect jitter similar to jitter generated on the actual transmission line can be generated according to the contents of the signal pattern. Further, there is no need for the same wiring and so on as the actual transmission line, thereby generating pattern effect jitter with a simple configuration.

Moreover, the passage of the input signal through the low-pass filters 40A, 40B, . . . makes it easy to detect the frequency characteristics of the input signal. Particularly, by using the plurality of low-pass filters 40A, 40B, . . . each having different cutoff frequencies, the variable phase can be adjusted according to various signal patterns and proper pattern effect jitter can be generated according to a signal pattern. Further, by adjusting the gains of the output voltages of each of the low-pass filters 40 (in the configuration of FIG. 1, the gains are adjusted by the gain adjusting circuits 30 provided respectively in the previous stages of the low-pass filters 40), the phase of the signal can be adjusted in consideration of the characteristics of the assumed transmission line and various kinds of pattern effect jitter can be generated for various transmission lines by the shared jitter generating circuit 1. Moreover, since the driver output circuit 60 is a differential amplifier, the timing of a change of the signal (the phase of the signal) outputted from the jitter generating circuit 1 can be easily changed with reliability.

Further, the signal in opposite phase with the signal outputted from the driver input circuit 10 is outputted from the driver input circuit 20, so that the phase of the input signal can be adjusted in such a direction that the timing of a change is deviated during the passage of the input signal through the transmission line. Thus it is possible to reproduce pattern effect jitter generated through the assumed transmission line.

Since the jitter generating circuit 1 of the present embodiment is provided between the DUT 2 and the driver 3, the jitter generating circuit 1 can be externally attached to the performance board and the socket board of a semiconductor tester for conducting various tests on the DUT 2. Thus jitter can be added, without changing the configuration of the semiconductor tester, to a signal inputted from the semiconductor tester to the DUT 2.

Figure 3:
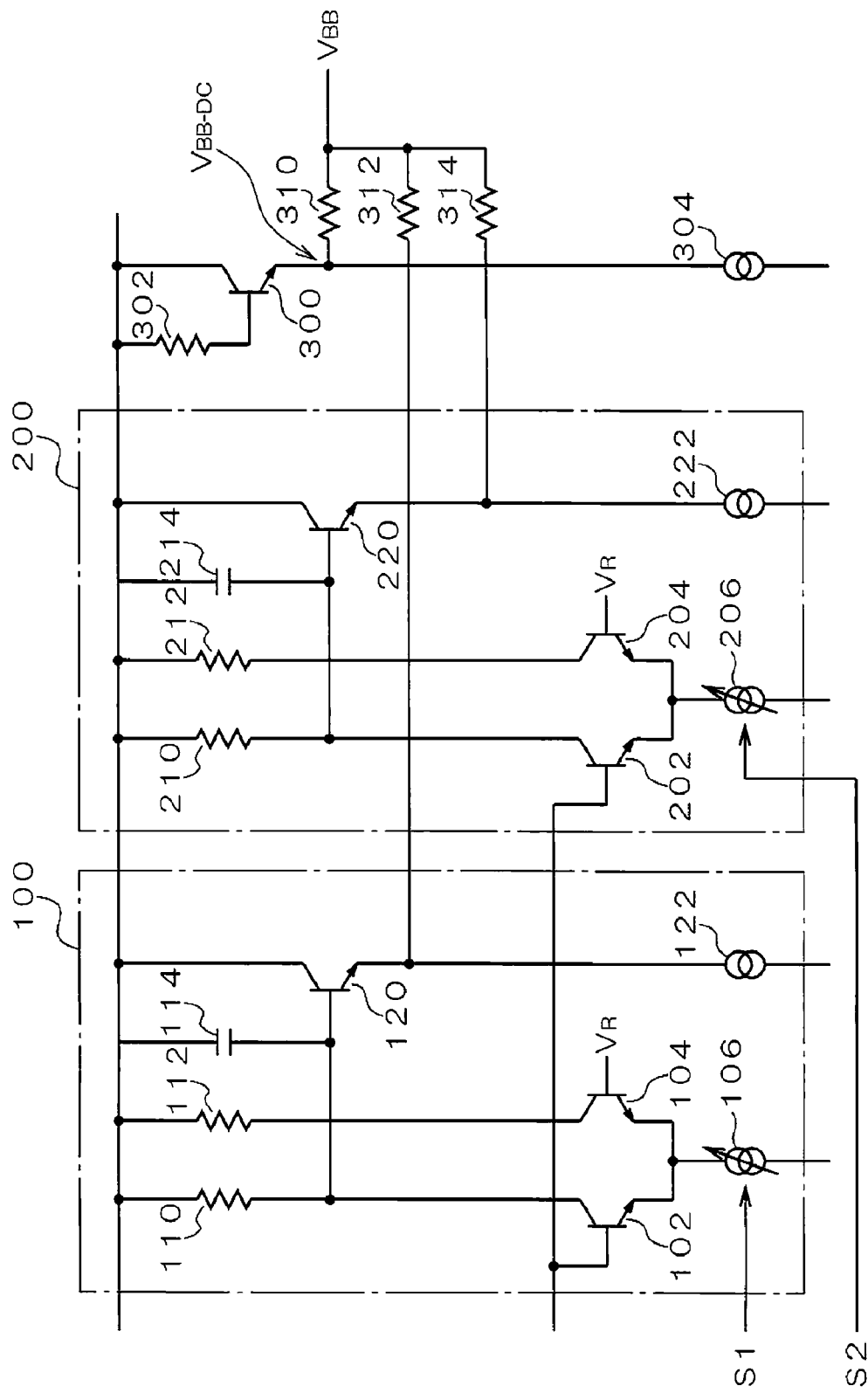
FIG. 3 is a circuit diagram partially showing the specific configuration of the jitter generating circuit.

FIG. 3 is a circuit diagram partially showing the specific configuration of the jitter generating circuit 1. In the configuration of FIG. 3, a specific configuration from the driver input circuit 20 to the adder 52 that is shown in FIG. 1 is shown for two processing systems. The configuration of FIG. 3 includes a first circuit 100 corresponding to one of the processing systems, a second circuit 200 corresponding to the other processing system, a transistor 300 for generating the predetermined voltage $V_{BB\text{-}DC}$, a resistor 302, a constant current circuit 304, and three resistors 310, 312, and 314 for adding the output voltages of the two processing systems to the predetermined voltage $V_{BB\text{-}DC}$.

The first circuit 100 includes two transistors 102 and 104 composing a differential amplifier, a variable constant current circuit 106 connected to the emitters of the two transistors 102 and 104 in a shared manner, resistors 110 and 112 serving as load resistors connected respectively to the collectors of the two transistors 102 and 104, a capacitor 114 connected in parallel with the resistor 110, and a transistor 120 and a constant current circuit 122 that are connected to the collector of the transistor 102.

The base of the transistor 102 is fed with the signal outputted from the driver 3. The base of the transistor 104 is fed with a reference signal having a predetermined reference voltage (e.g., the mean voltage of the low level and the high level of the signal inputted to the transistor 102) $V_R$. Therefore, a signal in opposite phase with the signal inputted to the transistor 102 is outputted from the collector of the transistor 102. The voltage level of the output signal can be varied by changing the constant current output value of the variable constant current circuit 106 according to the control data S1. The signal outputted from the collector of the transistor 102 is smoothed by a low-pass filter made up of the resistor 110 and the capacitor 114, and only low-frequency components equal to or smaller than a cutoff frequency determined by the device constants (resistance value and capacitance value) of the resistor 112 and the capacitor 114 are outputted through the transistor 120. The two transistors 102 and 104 correspond to the driver input circuit 20, the resistor 110 and the capacitor 114 correspond to the low-pass filter 40A, and the variable constant current circuit 106 corresponds to the gain adjusting circuit 30.

The second circuit 200 includes two transistors 202 and 204 composing a differential amplifier, a variable constant current circuit 206 connected to the emitters of the two transistors 202 and 204 in a shared manner, resistors 210 and 212 serving as load resistors connected respectively to the collectors of the two transistors 202 and 204, a capacitor 214 connected in parallel with the resistor 210, and a transistor 220 and a constant current circuit 222 that are connected to the collector of the transistor 202. The configuration and the operations of the parts of the second circuit 200 are basically similar to those of the first circuit 100. The second circuit 200 is different only in the cutoff frequency of the low-pass filter 40B made up of the resistor 210 and the capacitor 214. For example, the low-pass filter 40A made up of the resistor 110 and the capacitor 114 that are included in the first circuit 100 has a cutoff frequency set higher than the cutoff frequency of the low-pass filter 40B made up of the resistor 210 and the capacitor 214 that are included in the second circuit 200. Thus it is possible to detect frequency components up to the high-frequency components of the signal in opposite phase with the input signal in the first circuit 100 and detect low-frequency components of the signal in opposite phase with the input signal in the second circuit 200.

The output terminals of the first circuit 100, the second circuit 200, and the transistor 300 for generating the voltage $V_{BB-DC}$ are connected via the three resistors 310, 312, and 314, and the reference signal having the reference voltage $V_{BB}$ is outputted from the junction point of the resistors 310, 312, and 314. The reference voltage $V_{BB}$ is obtained by superimposing the output voltages of the two processing systems on the predetermined voltage $V_{BB-DC}$.

Figure 4:
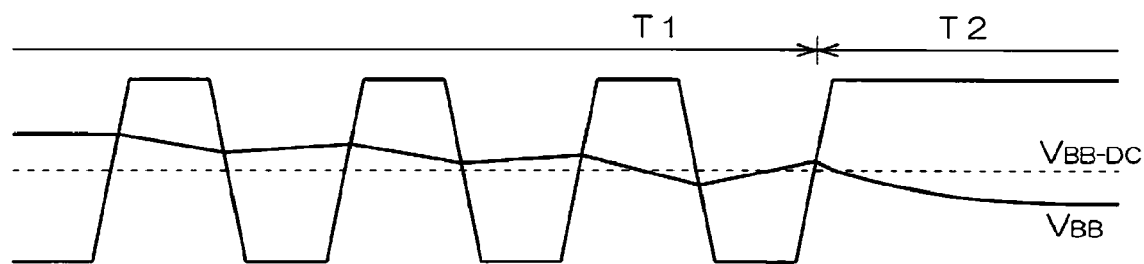
FIG. 4 is an explanatory drawing showing the operations of the jitter generating circuit.
Figure 4:
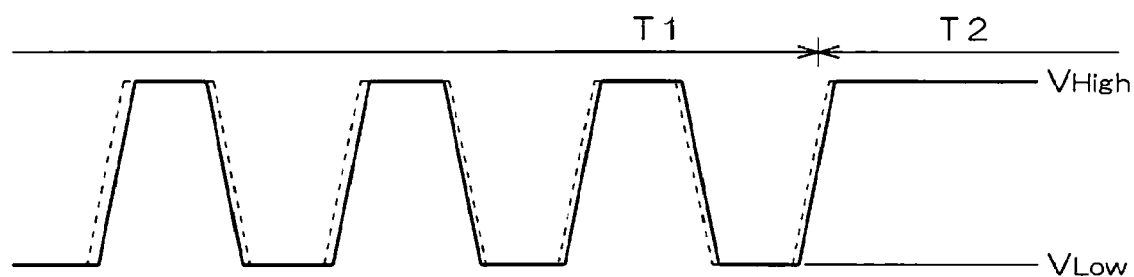

FIG. 4 is an explanatory drawing showing the operations of the jitter generating circuit 1. FIG. 4(A) illustrates the relationship between the signal outputted from the driver input circuit 10 and the reference voltage $V_{BB}$. FIG. 4(B) illustrates the jittered output signal of the driver output circuit 60.

In response to an input of a high-frequency signal that frequently switches between low and high levels after a continuous low-level state (period T1 in FIG. 4(A)), frequency components corresponding to the pattern change are detected by a first circuit 100 and a second circuit 200, the reference voltage $V_{BB}$ changing in accordance with the level change of the input signal is generated, and a signal jittered corresponding to the reference voltage $V_{BB}$ is outputted from the driver output circuit 60 (period T1 in FIG. 4(B)). In response to a decrease of a frequency at which the low and high levels are switched (period T2 in FIG. 4(A)), the reference voltage $V_{BB}$ is generated which changes in accordance with the level change of the input signal having low frequency components, and a signal jittered corresponding to the reference voltage $V_{BB}$ is outputted from the driver output circuit 60 (period T2 in FIG. 4(B)). In FIG. 4(B), a waveform having no jitter is indicated by a dotted line and a waveform with jitter is indicated by a solid line.

The present invention is not limited to the above embodiment and thus various modifications can be made within the gist of the present invention. In the above embodiment, the phase of the signal is adjusted using the driver output circuit 60 including a differential amplifier. A voltage comparator or a variable delay circuit may be used instead of a differential amplifier. When using a voltage comparator, it is preferable to input the output signal of the driver input circuit 10 to a positive input terminal and the reference signal having the reference voltage $V_{BB}$ to a negative input terminal. Further, when using a variable delay circuit, a delay amount is preferably set according to the reference voltage $V_{BB}$.

In the above embodiment, the plurality of low-pass filters 40A, 40B, . . . are used to analyze the contents (frequency characteristics) of the signal pattern of the input signal. Some or all of the low-pass filters may be replaced with band-pass filters or high-pass filters. Moreover, the configuration other than the filters, for example, a plurality of signal patterns (comparison patterns) to be detected may be prepared beforehand and correlation between the input signal and the plurality of comparison patterns may be determined to analyze the contents of the signal pattern of the input signal.

Further, in the above embodiment, although the driver input circuit 10 and the driver output circuit 60 are directly connected to each other in the jitter generating circuit 1, a delay circuit may be inserted between the driver input circuit 10 and the driver output circuit 60. The insertion of the delay circuit makes it possible to adjust the phase of the signal outputted from the driver input circuit 10.

Further, although the jitter generating circuit 1 is set between the driver 3 and the DUT 2 in the above embodiment, the jitter generating circuit 1 may be provided in the previous stage of the driver 3. In this case, the waveform shaping circuit 70 in the jitter generating circuit 1 may be omitted and the output signal of the driver output circuit 60 may be directly inputted to the driver 3. In the case where the driver 3 (circuit for outputting the input signal) and various circuits (not shown) provided in the previous stage are formed as a part of a single chip or a module, the jitter generating circuit 1 may be included in the chip or the module. It is thus possible to reduce the size of a circuit including the jitter generating circuit 1 and the driver 3 and the like and reduce the cost due to the simplified manufacturing process and a reduction in the number of components.

INDUSTRIAL APPLICABILITY

According to the present invention, the phase of an input signal is adjusted according to the contents of the signal pattern of the input signal, so that pattern effect jitter similar to jitter generated on a transmission line can be generated according to the contents of the signal pattern. Further, there is no need for the same wiring and so on as the actual transmission line, thereby generating pattern effect jitter with a simple configuration.

The invention claimed is:

1. A jitter generating circuit, comprising:
a signal analyzing unit for analyzing contents of a signal pattern of an input signal; and
a phase adjusting unit for outputting a signal obtained by adjusting a phase of the input signal in such a direction that timing of a change is deviated during passage of the input signal through a transmission line,
wherein the jitter generating circuit adds jitter by adjusting the phase of the input signal.

2. The jitter generating circuit according to claim 1, wherein the signal analyzing unit analyzes frequency characteristics of the input signal.

3. The jitter generating circuit according to claim 1, wherein the signal analyzing unit has a filter for passing a low frequency component of the input signal, and
the phase adjusting unit adjusts the phase according to an output voltage of the filter.

4. The jitter generating circuit according to claim 1, wherein the signal analyzing unit has a plurality of filters having different cutoff frequencies for passing a low frequency component of the input signal and a combining unit for combining output voltages of the plurality of filters, and
the phase adjusting unit adjusts the phase according to a combined voltage of the combining unit.

5. The jitter generating circuit according to claim 3, wherein the filter is fed with a signal in opposite phase with the input signal.

6. The jitter generating circuit according to claim 3, wherein the phase adjusting unit adjusts the phase according to a voltage obtained by subtracting the output voltage of the filter from a predetermined voltage.

7. The jitter generating circuit according to claim 4, wherein the filter is fed with a signal in opposite phase with the input signal.

8. The jitter generating circuit according to claim 4, wherein the phase adjusting unit adjusts the phase according to a voltage obtained by subtracting the output voltage of the filter from a predetermined voltage.

9. The jitter generating circuit according to claim 3, wherein the signal analyzing unit has a gain adjusting unit for adjusting a gain of the output voltage of the filter.

10. The jitter generating circuit according to claim 9, wherein the gain adjusted by the gain adjusting unit is set according to a signal loss of the transmission line.

11. The jitter generating circuit according to claim 1, wherein the phase adjusting unit is a differential amplifier that a reference voltage is changed according to an analysis result of the signal analyzing unit.

12. The jitter generating circuit according to claim 1, wherein the phase adjusting unit is a voltage comparator that a reference voltage is changed according to an analysis result of the signal analyzing unit.

13. The jitter generating circuit according to claim 1, wherein the phase adjusting unit is a variable delay circuit that a delay amount is changed according to an analysis result of the signal analyzing unit.

14. The jitter generating circuit according to claim 1, wherein the signal analyzing unit and the phase adjusting unit are included in a chip or a module having a circuit for outputting the input signal.

* * * * *